United States Patent Office 3,682,827
Patented Aug. 8, 1972

3,682,827
PIEZOELECTRIC OXIDE MATERIAL

Noboru Ichinose, Harutoshi Egami, Katsunori Yokoyama, and Yohachi Yamashita, Yokohama, Japan, assignors to Tokyo Shibaura Electric Co., Ltd., Kawasaki-shi, Japan Filed June 16, 1971, Ser. No. 153,734
Claims priority, application Japan, June 18, 1970, 45/52,383
Int. Cl. C04b 35/46, 35/48, 35/50
U.S. Cl. 252—62.9 1 Claim

ABSTRACT OF THE DISCLOSURE

A piezoelectric oxide material having a composition of 0.3 to 3.0 mol percent of $(Me_{1/2}La_{1/2})(Na_{1/2}Te_{1/2})O_3$ (where Me represents at least one metal selected from the group consisting of Ba, Sr, Ca, Pb; hereinafter referred to as "Me:Ba, Sr, Ca, Pb"), 60.0 to 30.0 mol percent of $PbTiO_3$ and 55.0 to 25.0 mol percent of $PbZrO_3$.

This invention relates to a piezoelectric oxide material and more particularly to a basic ternary piezoelectric material consisting of $(Me_{1/2}La_{1/2})(Na_{1/2}Te_{1/2})O_3$-$PbTiO_3$-$PbZrO_3$ prepared by solid phase reaction from a plurality of oxides having different valencies. This material has excellent piezoelectric properties and stability and is well adapted for use as an electro-acousto-mechanical conversion element.

As is well known, piezoelectric materials are widely used as ultrasonic vibrating elements, transducer elements of, for example, mechanical filters, ceramic filter elements, elements of pickups, microphones, vibrometers, and the like, ignition elements of, for example, gas ignitors. An improved binary piezoelectric oxide material $PbTiO_3$-$PbZrO_3$ composed in substantially equal mol percent has been developed to meet such wide applications. For example, attempts have been made to improve piezoelectric properties by adding CdO, ZnO, or the like to the binary piezoelectric oxide material $PbTiO_3$-$PbZrO_3$. However the resultant product had the serious disadvantages that its electromechanical coupling coefficient Kp was of the order of only 37–48% and that its characteristics varied with time and temperature.

The recently developed ternary piezoelectric oxide material $PbTiO_3$-$PbZrO_3$-$Pb(Mg_{1/3}Nb_{2/3})O_3$ has also the serious disadvantages that its electromechanical coupling coefficient K*p* is of the order of 50% max. and that its mechanical quality factor Q*m* is 600 or less. It should be noted that a piezoelectric material having a mechanical quality factor Q*m* of 568 presents an electromechanical coupling coefficient K*p* of 7.5%. Generally, however, piezoelectric materials are preferred to have as large an electromechanical coupling coefficient as possible.

The properties of piezoelectric materials adapted for use in the aforementioned applications can be evaluated by the various constants such as electromechanical coupling coefficient, output voltage coefficient etc. Generally, the application of a high mechanical pressure results in lowering of output voltage as well as of the electromechanical coupling coefficient $K_{33}$, and raises an important practical problem. Accordingly, in the manufacture of desirable piezoelectric materials, there should be taken into account the decrease in output voltage resulting from application of high mechanical pressure in addition to the aforesaid constants. Application of high mechanical pressure leads to declines not only in the aforesaid output voltage but also in the electric properties demanded of piezoelectric materials used as ultrasonic elements, piezoelectric transformer elements, etc.

Accordingly, an object of the invention is to provide unusually stable piezoelectric materials, free from the aforesaid drawbacks, which present little deterioration in piezoelectric properties even when repeatedly operated at a high pressure ranging from 100 to 2000 kg./cm.$^2$ and consequently are capable of maintaining the capacity of generating the desired high voltage.

Another object of the invention is to provide piezoelectric materials adapted for the generation of spark discharges used in igniting a gas ignitor or a small-size engine.

According to this invention, there are provided piezoelectric oxide materials having a composition of 0.3 to 30 mol percent of $(Me_{1/2}La_{1/2})(Na_{1/2}Te_{1/2})O_3$ (where Me denotes at least one metal selected from the group of Ba, Sr, Ca and Pb), 60.0 to 30.0 mol percent of $PbTiO_3$ and 55.0 to 25.0 mol percent of $PbZrO_3$, totaling 100 mol percent.

The present invention can be more fully understood from the following detailed description when taken in connection with reference to the accompanying drawings, in which.

Figure 3:
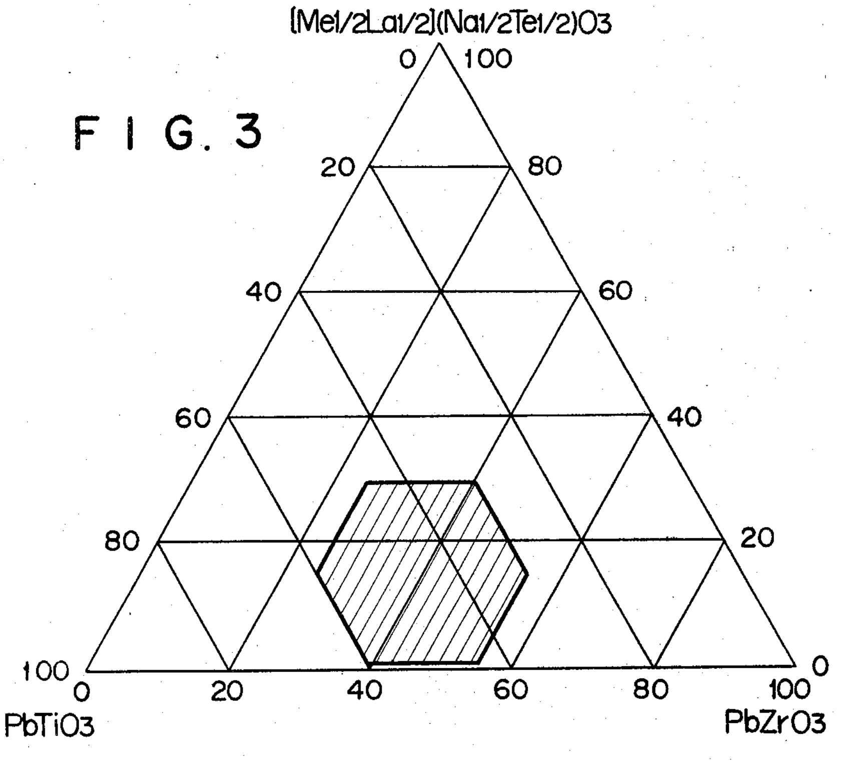

fixed and those of $PbTiO_3$ and $PbZrO_3$ varied;

FIG. 3 is a triangular chart of a ternary system representing the basic composition of the invention:

$$(Me_{1/2}La_{1/2})(Na_{1/2}Te_{1/2})O_3\text{-}PbTiO_3\text{-}PbZrO_3$$

Figure 4:
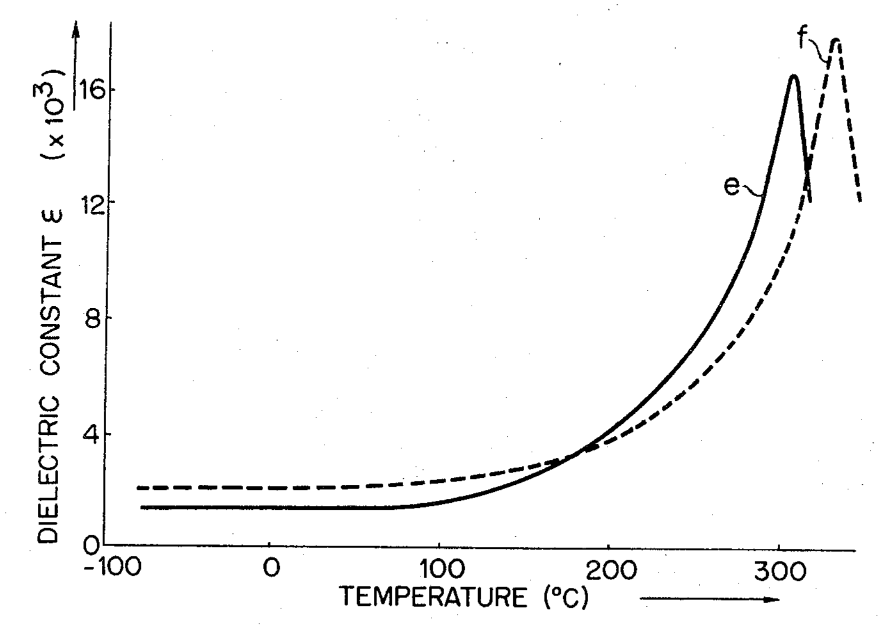
Figure 5:
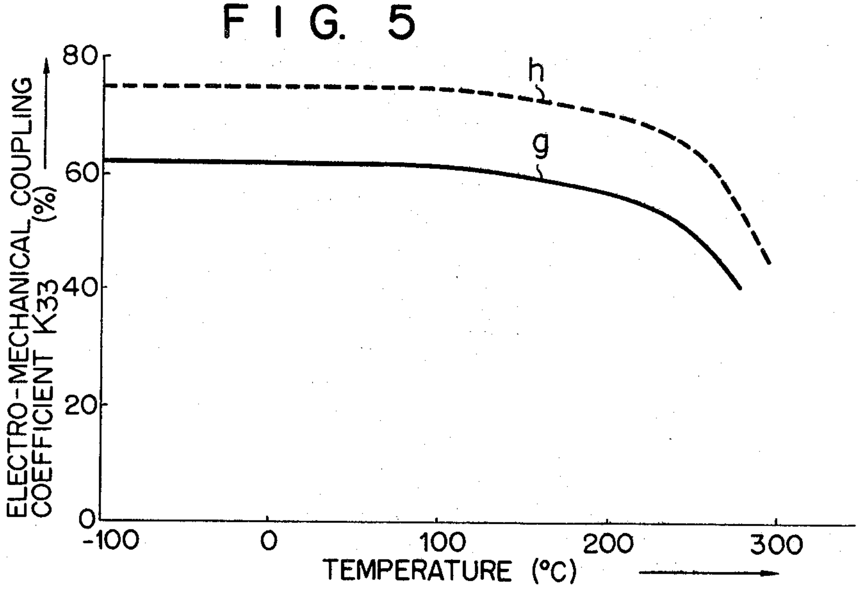
Figure 6:
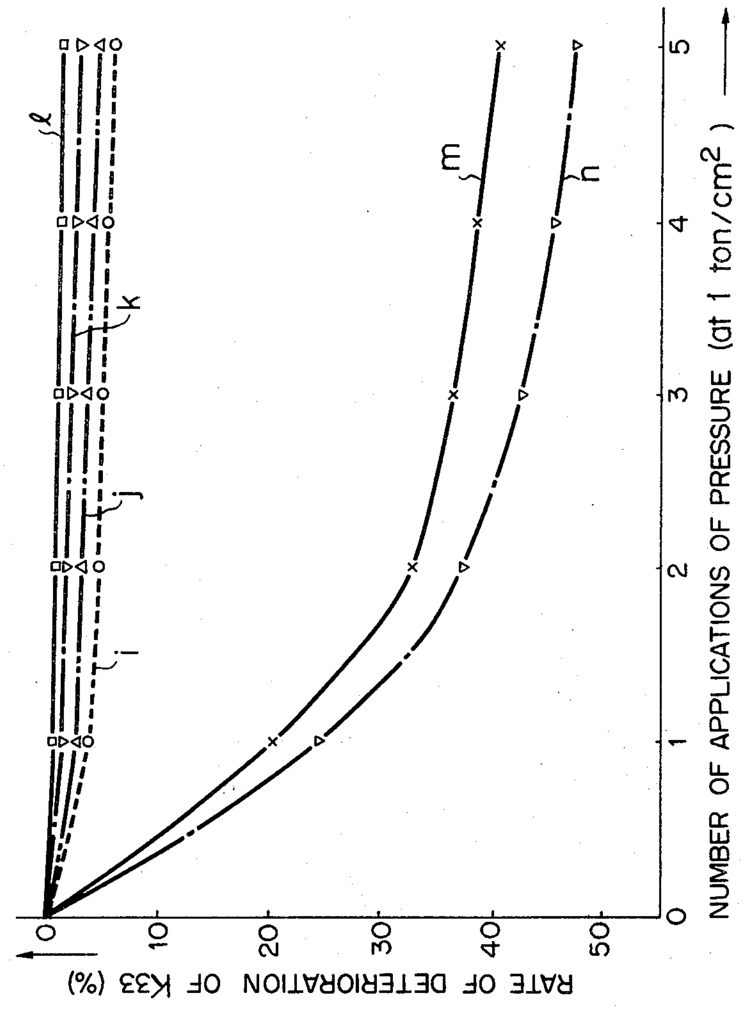

FIG. 4 is a curve diagram of the dielectric constant vs temperature characteristics of two examples of the invention;

FIG. 5 is a curve diagram of the electromechanical coupling coefficient vs. temperature characteristics of two examples of the invention; and FIG. 6 is a curve diagram of the electromechanical coupling coefficient vs. pressure characterisitcs of four examples of the invention and two references of the prior art.

The piezoelectric oxide material of the invention is composed of a plurality of oxides having different valences and obtained by solid phase reaction. It consists of a ternary system $(Me_{1/2}La_{1/2})$ $(Na_{1/2}Te_{1/2})O_3$-$PbTiO_3$-$PbZrO_3$ obtained by substituting $(Me_{1/2}La_{1/2})$ $$(Na_{1/2}Te_{1/2})O_3$$

of a perovskite structure for part of the binary system $PbTiO_3$-$PbZrO_3$. The composition is given as 30.0 to 0.3 mol percent of $(Me_{1/2}La_{1/2})$ $(Na_{1/2}Te_{1/2})O_3$, 30.0 to 60.0 mol percent of $PbTiO_3$, and 25.0 to 55.0 mol percent of $PbZrO_3$, totaling 100 mol percent.

The piezoelectric material of the invention can be readily manufactured by powder metallurgical technology. Raw oxide materials such as $La_2O_3$, $TiO_2$, $Na_2O$, $ZrO_2$, $TeO_3$ and MeO are accurately weighed out in a prescribed ratio and are well mixed in a ball mill, or the like. The materials used may consist of compounds thermally convertible to oxides, such as hydroxides, carbonates or oxalates of metals.

The mixture is presintered in the temperature range of about 600–900° C. and pulverized in a ball mill to a controlled particle size. A binding agent such as water or polyvinyl alcohol is then added to the mixture. After being molded at a pressure ranging from about 0.5 to 2 ton/cm.[2], the molded body is sintered at temperatures of 1000 to 1270° C. carefully in a closed furnace to prevent the partial evaporation of PbO, a component of the piezoelectric material. The time required to hold the mass at a maximum temperature usually ranges from about 0.5 to 3 hours. Polarization of the sintered mass of oxides may be effected by a known process, for example, by mounting a pair of electrodes on both sides thereof and applying for about one hour a D.C. field of 20 to 30 kv./cm. across the electrodes. The mass is in silicone oil and at a temperature of about 140° to 160° C.

Figure 1:
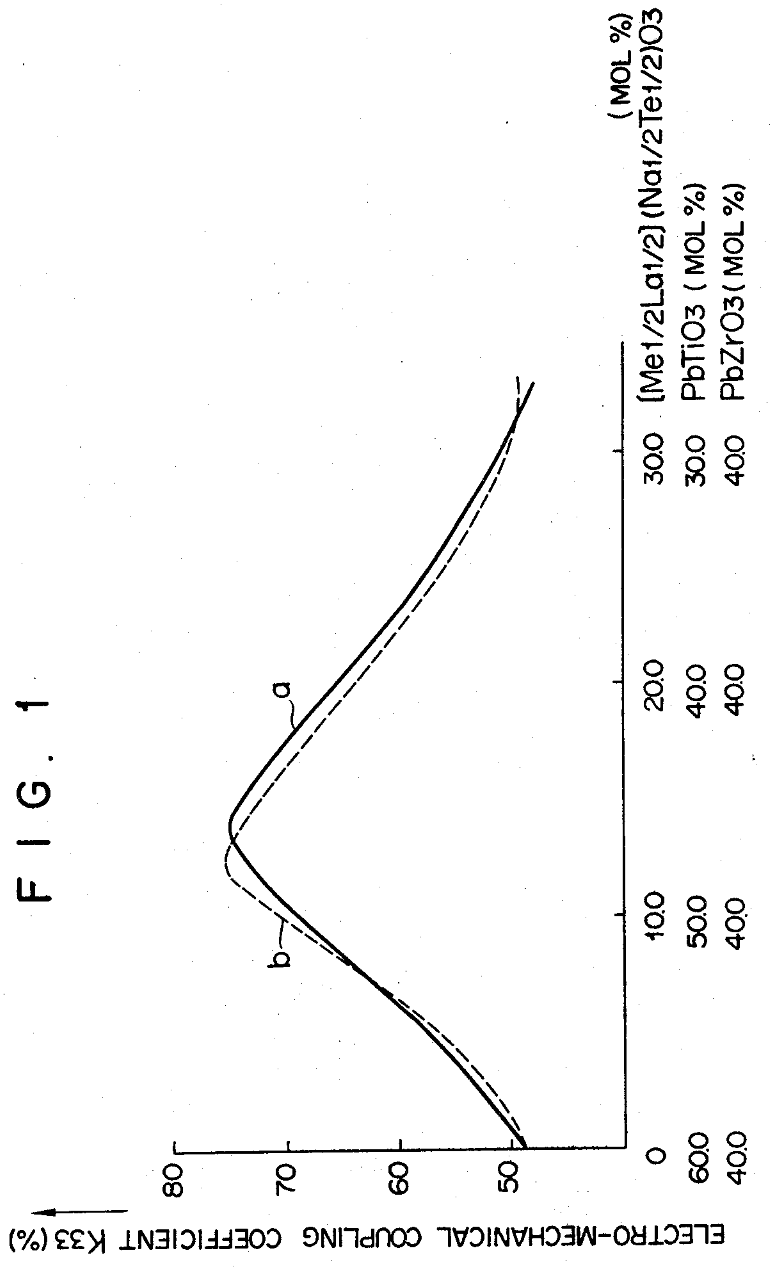
FIG. 1 is a curve diagram showing variations in the electromechanical coupling coefficient $K_{33}$ of two kinds of piezoelectric ternary oxide material according to this invention with the proportion of $PbZrO_3$ fixed and those of $(Me_{1/2}La_{1/2})(Na_{1/2}Te_{1/2})O_3$ varied.

The reason why the proportions of the components $(Me_{1/2}La_{1/2})$ $(Na_{1/2}Te_{1/2})O_3$ (Me, Ba, Sr, Ca, Pb), $PbTiO_3$ and $PbZrO_3$ constituting the piezoelectric oxide materials of this invention should be limited to the aforesaid ranges follow: If the content of $(Me_{1/2}La_{1/2})$ $$(Na_{1/2}Te_{1/2})O_3$$

is under 0.3 mol percent or above 30.0 mol percent, the necessary value of electromechanical coupling coefficient ($K_{33}$=50%) for piezoelectric ignition cannot be obtained. When a determination was made of variations in the electromechanical coupling coefficient $K_{33}$ of piezoelectric oxide materials by changing, for example, the proportions of $(Me_{1/2}La_{1/2})$ $(Na_{1/2}Te_{1/2})O_3$, (Me:Ba, Sr, Ca, Pb), $PbTiO_3$ and $PbZrO_3$, the curves of FIG. 2 were obtained. A content of $(Me_{1/2}La_{1/2})$ $(Na_{1/2}Te_{1/2})O_3$ outside of the range of 0.3 to 30.0 failed to produce the desired piezoelectric properties. Referring to FIG. 1, the curve *a* represents the case of Me:Ba and the curve *b* the case of Me:Sr.

Figure 2:
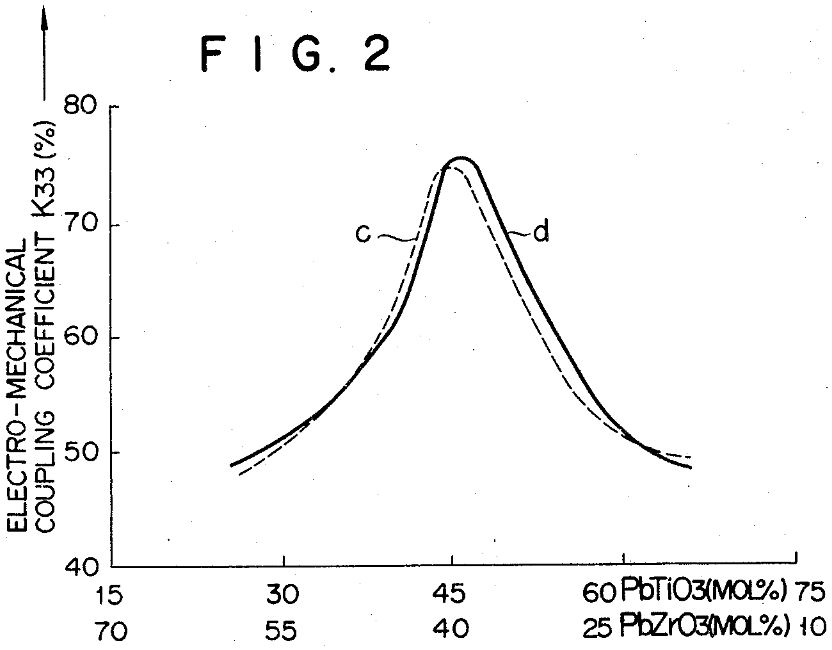
FIG. 2 is a curve diagram showing variations in the electromechanical coupling coefficient $K_{33}$ of two kinds of piezoelectric ternary oxide material according to this invention with the proportion of $$(Me_{1/2}La_{1/2})(Na_{1/2}Te_{1/2})O_3$$

When a determination was made of variations in the properties of piezoelectric materials with the amount of $(Me_{1/2}La_{1/2})$ $(Na_{1/2}Te_{1/2})O_3$ fixed at 15 mol percent and those of $PbTiO_3$ and $PbZrO_3$ changed, the curves in FIG. 2. The curve *c* represents the case of Me:Ca and the curve *d* the case of Me:Pb.

As is apparent from FIG. 2, when the proportion of $PbTiO_3$ fell to below 30.0 mol percent, there was not realized the desired piezoelectric properties. In case said proportion exceeded 60.0 mol percent, there were not produced piezoelectric materials having the desired properties, or they were unsatisfactory in respect of stability, though they raised no practical problem with respect to piezoelectric properties. Therefore, the proportion of $PbTiO_3$ should always be defined within the aforementioned range. Similarly, $PbZrO_3$, the remaining component of the ternary system $(Me_{1/2}La_{1/2})$ $(Na_{1/2}Te_{1/2})O_3$, $PbTiO_3$ and $PbZrO_3$, should always be used in amounts ranging between 25.0 and 55.0 mol percent in order to produce piezoelectric materials having desired properties. Thus, the composition of the ternary system is limited to the hatched region of FIG. 3.

Note that the component $(Me_{1/2}La_{1/2})$ $(Na_{1/2}Te_{1/2})O_3$ concurrently acts as a mineralizer to facilitate the sintering process, thereby reducing the sintering temperature, preventing the evaporation of PbO contained in its components, and producing a compact piezoelectric material.

As mentioned above, the main composition of piezoelectric oxide materials of this invention consists of a uniform solid solution of the so-called perovskite structure (confirmed by X-ray analysis). Expressed in a general formula $ABO_3$, it consists of a plurality of elements having different valences, as A denoted divalent Me or trivalent La, and B univalent Na, hexavalent Te, tetravalent Ti or tetravalent Zr. However, the piezoelectric materials of this invention having the specified composition are essentially different from the conventional product. If its composition is expressed in the general formula $A'B'O_3$, B' represents tetravalent elements in case A' denotes divalent elements and B' represents pentavalent elements in case A' denotes univalent elements, that is, A' and B' respectively consist of combinations of elements having the same valence. In addition, the piezoelectric material of the invention has excellent piezoelectric characteristics substantially unaffected by time and temperature variations, always displaying a prescribed performance.

When experiments were made to determine variations in the voltage generated upon impact by piezoelectric materials used as ignition elements, it was confirmed that the prior art piezoelectric materials having a $PbTiO_3$-$PbZrO_3$ system exhibited as large as 15% in the voltage produced when subjected to impacts a million times, whereas the present product only indicates as small a decrease as around 5% under the same conditions. Since the voltage drop in this breakdown test eventually reduces ignition reliability, the piezoelectric material of the invention is of great advantage.

The examples of this invention as well as references will now be described. Prescribed proportions of $La_2O_3$, $Na_2O$, $TiO_2$, $ZrO_2$, $TeO_3$ and MeO (Me:Ba, Sr, Ca, Pb) were accurately weighed out so as to cause the amount of $(Me_{1/2}La_{1/2})$ $(Na_{1/2}Te_{1/2})O_3$ to account for 0.2 to 31 mol percent, that of $PbTiO_3$ for 29 to 61 mol percent and that of $PbZrO_3$ for 24 to 56 mol percent and well mixed in a ball mill. The mixture was presintered at 850° C. and pulverized again in a ball mill to a prescribed particle size of 1 to 2 microns. 109 types of samples, including references, are thus prepared. After a binding agent such as polyvinyl alcohol was added, the powders were molded at a pressure of 1 ton/cm.[2] and sintered one hour at temperatures of 1000 to 1280° C. to obtain disks 1 mm. thick and 13 mm. in diameter, together with rod samples 15 mm. long and 7 mm. in diameter.

The disks thus prepared were measured for density and those disk and rod samples which were fitted with electrodes were measured for dielectric properties. After being polarized by impressing a D.C. field of 30 kv./cm. in silicone oil at 140° C. for one hour, the samples were determined for piezoelectric properties by the standard process set forth in the proceedings of the IRE, vol. 137, pp. 1378–1395, 1949. The results of the measurements together with the compositions of these sintered products are listed in Table I.

TABLE I

| Sample | $PbTiO_3$ | $PbZrO_3$ | $(Me_{1/2}La_{1/2})\cdot(Na_{1/2}Te_{1/2})O_3$ | F.T. (° C.) | D | $\epsilon$ | $K_{33}$ | Decrease in $K_{33}$ (percent) |
|---|---|---|---|---|---|---|---|---|
| Reference: | | | | | | | | |
| 1 | 61.0 | 39.0 | 0 | 1,280 | 7.40 | 851 | 43.2 | 22.3 |
| 2 | 61.0 | 34.0 | Me:Ba 5.0 | 1,260 | 7.43 | 939 | 48.5 | 12.8 |
| 3 | 61.0 | 29.0 | Me:Sr 10.0 | 1,240 | 7.48 | 998 | 48.9 | 10.0 |
| 4 | 61.0 | 24.0 | Me:Ca 15.0 | 1,220 | 7.51 | 975 | 47.0 | 12.7 |
| 5 | 61.0 | 38.8 | Me:Pb 0.2 | 1,270 | 7.47 | 904 | 49.5 | 9.5 |
| Example: | | | | | | | | |
| 1 | 60.0 | 39.7 | Me:Ba 0.3 | 1,260 | 7.52 | 936 | 50.2 | 3.7 |
| 2 | 60.0 | 39.7 | Me:Sr 0.3 | 1,260 | 7.54 | 961 | 50.6 | 3.4 |
| 3 | 60.0 | 39.7 | Me:Ca 0.3 | 1,260 | 7.51 | 912 | 50.1 | 3.0 |
| 4 | 60.0 | 39.7 | Me:Pb 0.3 | 1,260 | 7.52 | 920 | 50.3 | 3.2 |
| 5 | 60.0 | 35.0 | Me:Ba 5.0 | 1,240 | 7.56 | 1,187 | 53.9 | 2.8 |
| 6 | 60.0 | 35.0 | Me:Sr 5.0 | 1,240 | 7.57 | 1,204 | 55.1 | 3.0 |
| 7 | 60.0 | 35.0 | Me:Ca 5.0 | 1,240 | 7.55 | 1,016 | 54.3 | 2.6 |
| 8 | 60.0 | 35.0 | Me:Pb 5.0 | 1,240 | 7.58 | 1,088 | 55.2 | 2.7 |
| 9 | 60.0 | 29.0 | Me:Ba 11.0 | 1,220 | 7.61 | 1,345 | 55.9 | 3.1 |
| 10 | 60.0 | 29.0 | Me:Sr 11.0 | 1,220 | 7.60 | 1,481 | 56.2 | 3.3 |
| 11 | 60.0 | 29.0 | Me:Ca 11.0 | 1,220 | 7.63 | 1,207 | 55.7 | 3.5 |

TABLE I—Continued

| Sample | $PbTiO_3$ | $PbZrO_3$ | $(Me_{1/2}La_{1/2})\cdot(Na_{1/2}Te_{1/2})O_3$ | F.T. (° C.) | D | ε | $K_{33}$ | Decrease in $K_{33}$ (percent) |
|---|---|---|---|---|---|---|---|---|
| 12 | 60.0 | 29.0 | Me:Pb 11.0 | 1,220 | 7.62 | 1,296 | 56.4 | 3.0 |
| 13 | 60.0 | 29.0 | Me:Ba 5.0; Me:Sr 6.0 | 1,220 | 7.62 | 1,374 | 55.8 | 3.1 |
| 14 | 60.0 | 29.0 | Me:Ca 5.0; Me:Pb 6.0 | 1,220 | 7.64 | 1,260 | 56.2 | 2.9 |
| 15 | 52.0 | 47.5 | Me:Ba 0.5 | 1,240 | 7.55 | 955 | 53.0 | 2.4 |
| 16 | 52.0 | 47.5 | Me:Sr 0.5 | 1,240 | 7.58 | 969 | 53.3 | 2.2 |
| 17 | 52.0 | 47.5 | Me:Ca 0.5 | 1,240 | 7.54 | 927 | 51.8 | 2.0 |
| 18 | 52.0 | 47.5 | Me:Pb 0.5 | 1,240 | 7.57 | 944 | 53.5 | 2.3 |
| 19 | 52.0 | 41.0 | Me:Ba 7.0 | 1,220 | 7.60 | 1,091 | 56.6 | 2.7 |
| 20 | 52.0 | 41.0 | Me:Sr 7.0 | 1,220 | 7.61 | 1,122 | 55.8 | 2.5 |
| 21 | 52.0 | 41.0 | Me:Ca 7.0 | 1,220 | 7.59 | 986 | 54.3 | 2.4 |
| 22 | 52.0 | 41.0 | Me:Pb 7.0 | 1,220 | 7.63 | 995 | 56.5 | 2.6 |
| 23 | 52.0 | 33.0 | Me:Ba 15.0 | 1,200 | 7.66 | 1,591 | 60.7 | 2.8 |
| 24 | 52.0 | 33.0 | Me:Sr 15.0 | 1,200 | 7.68 | 1,608 | 60.1 | 2.5 |
| 25 | 52.0 | 33.0 | Me:Ca 15.0 | 1,200 | 7.65 | 1,470 | 59.9 | 2.4 |
| 26 | 52.0 | 33.0 | Me:Pb 15.0 | 1,200 | 7.69 | 1,496 | 60.6 | 2.1 |
| 27 | 52.0 | 33.0 | Me:Ba 15.0; Me:Ca 15.0; Me:Pb 15.0 | 1,200 | 7.70 | 1,503 | 60.7 | 2.0 |
| 28 | 52.0 | 33.0 | Me:Sr 15.0; Me:Ca 15.0; Me:Pb 15.0 | 1,200 | 7.69 | 1,512 | 60.4 | 2.2 |
| 29 | 52.0 | 27.0 | Me:Ba 21.0 | 1,170 | 7.59 | 1,348 | 57.9 | 2.0 |
| 30 | 52.0 | 27.0 | Me:Sr 21.0 | 1,170 | 7.60 | 1,387 | 58.1 | 1.8 |
| 31 | 52.0 | 27.0 | Me:Ca 21.0 | 1,170 | 7.58 | 1,146 | 57.4 | 2.1 |
| 32 | 52.0 | 27.0 | Me:Pb 21.0 | 1,170 | 7.61 | 1,232 | 58.6 | 1.9 |
| 33 | 46.0 | 53.5 | Me:Ba 0.5 | 1,220 | 7.55 | 1,053 | 52.2 | 1.8 |
| 34 | 46.0 | 53.5 | Me:Sr 0.5 | 1,220 | 7.58 | 1,161 | 53.1 | 1.5 |
| 35 | 46.0 | 53.5 | Me:Ca 0.5 | 1,220 | 7.56 | 1,004 | 51.9 | 1.9 |
| 36 | 46.0 | 53.5 | Me:Pb 0.5 | 1,220 | 7.59 | 1,036 | 52.8 | 1.4 |
| 37 | 46.0 | 47.0 | Me:Ba 7.0 | 1,200 | 7.64 | 1,590 | 60.3 | 1.3 |
| 38 | 46.0 | 47.0 | Me:Sr 7.0 | 1,200 | 7.62 | 1,638 | 62.4 | 1.7 |
| 39 | 46.0 | 47.0 | Me:Ca 7.0 | 1,200 | 7.60 | 1,417 | 61.1 | 1.6 |
| 40 | 46.0 | 47.0 | Me:Pb 7.0 | 1,200 | 7.65 | 1,503 | 62.8 | 1.8 |
| 41 | 46.0 | 40.0 | Me:Ba 14.0 | 1,180 | 7.70 | 2,125 | 72.6 | 2.2 |
| 42 | 46.0 | 40.0 | Me:Sr 14.0 | 1,180 | 7.71 | 2,341 | 75.1 | 2.0 |
| 43 | 46.0 | 40.0 | Me:Ca 14.0 | 1,180 | 7.69 | 1,916 | 73.3 | 1.9 |
| 44 | 46.0 | 40.0 | Me:Pb 14.0 | 1,180 | 7.72 | 2,007 | 74.8 | 2.1 |
| 45 | 46.0 | 40.0 | Me:Ba 3.5; Me:Sr 3.5; Me:Ca 3.5; Me:Pb 3.5 | 1,180 | 7.73 | 2,122 | 75.0 | 1.8 |
| 46 | 46.0 | 29.0 | Me:Ba 25.0 | 1,140 | 7.63 | 1,695 | 60.2 | 2.4 |
| 47 | 46.0 | 29.0 | Me:Sr 25.0 | 1,140 | 7.65 | 1,810 | 61.1 | 2.0 |
| 48 | 46.0 | 29.0 | Me:Ca 25.0 | 1,140 | 7.61 | 1,574 | 59.3 | 2.2 |
| 49 | 46.0 | 29.0 | Me:Pb 25.0 | 1,140 | 7.64 | 1,600 | 60.7 | 2.4 |
| 50 | 46.0 | 25.0 | Me:Ba 29.0 | 1,120 | 7.58 | 1,318 | 51.8 | 1.3 |
| 51 | 46.0 | 25.0 | Me:Sr 29.0 | 1,120 | 7.60 | 1,406 | 52.1 | 1.5 |
| 52 | 46.0 | 25.0 | Me:Ca 29.0 | 1,120 | 7.56 | 1,188 | 51.0 | 1.3 |
| 53 | 46.0 | 25.0 | Me:Pb 29.0 | 1,120 | 7.59 | 1,227 | 51.6 | 1.7 |
| 54 | 40.0 | 55.0 | Me:Ba 5.0 | 1,220 | 7.51 | 981 | 50.8 | 2.0 |
| 55 | 40.0 | 55.0 | Me:Sr 5.0 | 1,220 | 7.53 | 1,123 | 51.3 | 1.7 |
| 56 | 40.0 | 55.0 | Me:Ca 5.0 | 1,220 | 7.50 | 935 | 50.7 | 2.1 |
| 57 | 40.0 | 55.0 | Me:Pb 5.0 | 1,220 | 7.54 | 964 | 51.8 | 2.0 |
| 58 | 40.0 | 51.0 | Me:Ba 9.0 | 1,200 | 7.59 | 1,208 | 59.0 | 1.1 |
| 59 | 40.0 | 51.0 | Me:Sr 9.0 | 1,200 | 7.61 | 1,412 | 59.6 | 1.0 |
| 60 | 40.0 | 51.0 | Me:Ca 9.0 | 1,200 | 7.57 | 1,189 | 57.4 | 1.5 |
| 61 | 40.0 | 51.0 | Me:Pb 9.0 | 1,200 | 7.63 | 1,200 | 59.9 | 1.2 |
| 62 | 40.0 | 44.0 | Me:Ba 16.0 | 1,180 | 7.65 | 1,722 | 64.1 | 1.5 |
| 63 | 40.0 | 44.0 | Me:Sr 16.0 | 1,180 | 7.67 | 1,917 | 65.0 | 1.8 |
| 64 | 40.0 | 44.0 | Me:Ca 16.0 | 1,180 | 7.63 | 1,529 | 63.3 | 2.0 |
| 65 | 40.0 | 44.0 | Me:Pb 16.0 | 1,180 | 7.66 | 1,631 | 64.6 | 1.6 |
| 66 | 40.0 | 44.0 | Me:Ba 4.0; Me:Sr 4.0; Me:Ca 4.0; Me:Pb 4.0 | 1,180 | 7.67 | 1,748 | 65.0 | 1.4 |
| 67 | 40.0 | 44.0 | Me:Ba 5.0; Me:Sr 5.0; Me:Ca 3.0; Me:Pb 3.0 | 1,180 | 7.66 | 1,805 | 64.8 | 1.3 |
| 68 | 40.0 | 31.0 | Me:Ba 29.0 | 1,140 | 7.58 | 1,287 | 53.6 | 1.1 |
| 69 | 40.0 | 31.0 | Me:Sr 29.0 | 1,140 | 7.60 | 1,884 | 54.1 | 1.0 |
| 70 | 40.0 | 31.0 | Me:Ca 29.0 | 1,140 | 7.55 | 1,129 | 52.8 | 0.9 |
| 71 | 40.0 | 31.0 | Me:Pb 29.0 | 1,140 | 7.59 | 1,188 | 53.7 | 1.4 |
| 72 | 35.0 | 54.0 | Me:Ba 11.0 | 1,160 | 7.61 | 1,200 | 52.6 | 2.5 |
| 73 | 35.0 | 54.0 | Me:Sr 11.0 | 1,160 | 7.63 | 1,311 | 53.2 | 2.6 |
| 74 | 35.0 | 54.0 | Me:Ca 11.0 | 1,160 | 7.59 | 1,135 | 51.9 | 2.1 |
| 75 | 35.0 | 54.0 | Me:Pb 11.0 | 1,160 | 7.65 | 1,197 | 53.0 | 2.7 |
| 76 | 35.0 | 45.0 | Me:Ba 20.0 | 1,130 | 7.66 | 1,348 | 54.4 | 2.0 |
| 77 | 35.0 | 45.0 | Me:Sr 20.0 | 1,130 | 7.67 | 1,583 | 55.0 | 2.2 |
| 78 | 35.0 | 45.0 | Me:Ca 20.0 | 1,130 | 7.62 | 1,212 | 53.8 | 2.5 |
| 79 | 35.0 | 45.0 | Me:Pb 20.0 | 1,130 | 7.65 | 1,286 | 55.4 | 2.4 |
| 80 | 35.0 | 35.0 | Me:Ba 30.0 | 1,100 | 7.56 | 1,168 | 50.6 | 1.0 |
| 81 | 35.0 | 35.0 | Me:Sr 30.0 | 1,100 | 7.58 | 1,231 | 51.0 | 1.2 |
| 82 | 35.0 | 35.0 | Me:Ca 30.0 | 1,100 | 7.54 | 1,017 | 50.2 | 0.8 |
| 83 | 35.0 | 35.0 | Me:Pb 30.0 | 1,100 | 7.57 | 1,096 | 51.1 | 1.1 |
| 84 | 35.0 | 35.0 | Me:Ba 15.0; Me:Pb 15.0 | 1,100 | 7.59 | 1,124 | 51.3 | 0.9 |
| 85 | 35.0 | 35.0 | Me:Sr 15.0; Me:Ca 15.0 | 1,100 | 7.60 | 1,211 | 51.0 | 1.0 |
| 86 | 30.0 | 55.0 | Me:Ba 15.0 | 1,140 | 7.54 | 1,177 | 50.7 | 2.4 |
| 87 | 30.0 | 55.0 | Me:Sr 15.0 | 1,140 | 7.56 | 1,289 | 52.0 | 2.6 |
| 88 | 30.0 | 55.0 | Me:Ca 15.0 | 1,140 | 7.53 | 1,091 | 51.1 | 2.3 |
| 89 | 30.0 | 55.0 | Me:Pb 15.0 | 1,140 | 7.60 | 1,108 | 51.6 | 2.1 |
| 90 | 30.0 | 48.0 | Me:Ba 22.0 | 1,100 | 7.61 | 1,342. | 53.4 | 2.0 |
| 91 | 30.0 | 48.0 | Me:Sr 22.0 | 1,100 | 7.64 | 1,516 | 54.3 | 1.8 |
| 92 | 30.0 | 48.0 | Me:Ca 22.0 | 1,100 | 7.58 | 1,283 | 52.9 | 1.6 |
| 93 | 30.0 | 48.0 | Me:Pb 22.0 | 1,100 | 7.66 | 1,304 | 53.7 | 1.9 |
| 94 | 30.0 | 48.0 | Me:Ba 5.5; Me:Sr 5.5; Me:Ca 5.5; Me:Pb 5.5 | 1,100 | 7.68 | 1,361 | 54.0 | 1.5 |
| 95 | 30.0 | 40.0 | Me:Ba30.0 | 1,060 | 7.58 | 1,062 | 50.2 | 1.4 |
| 96 | 30.0 | 40.0 | Me:Sr 30.0 | 1,060 | 7.57 | 1,180 | 50.9 | 1.8 |
| 97 | 30.0 | 40.0 | Me:Ca 30.0 | 1,060 | 7.55 | 986 | 50.1 | 2.1 |
| 98 | 30.0 | 40.0 | Me:Pb 30.0 | 1,060 | 7.60 | 999 | 50.4 | 2.5 |
| 99 | 30.0 | 40.0 | Me:Ba 10.0; Me:Sr 10.0; Me:Ca 10.0 | 1,060 | 7.59 | 1,073 | 50.6 | 1.9 |
| 100 | 30.0 | 40.0 | Me:Sr 10.0; Me:Ca 10.0; Me:Pb 10.0 | 1,060 | 7.61 | 1,044 | 50.3 | 2.0 |
| Reference: | | | | | | | | |
| 6 | 29.0 | 56.0 | Me:Ba 15.0 | 1,160 | 7.45 | 1,021 | 48.6 | 5.4 |
| 7 | 29.0 | 56.0 | Me:Sr 15.0 | 1,160 | 7.46 | 1,106 | 49.3 | 6.1 |
| 8 | 29.0 | 56.0 | Me:Ca 15.0 | 1,160 | 7.43 | 1,000 | 48.3 | 6.8 |
| 9 | 29.0 | 56.0 | Me:Pb 15.0 | 1,160 | 7.47 | 1,018 | 49.0 | 5.9 |

NOTE.—F.T.=firing temperature or sintering temperature, ° C.; D=specific gravity (measured at 23° C.); ε=dielectric constant (measured at 1 kHz. and 23° C.); $K_{33}$=electromechanical coupling coefficient (percent).

When variations of dielectric constant with temperature were measured in Examples 23 and 44 having Curie points of 305° C. and 330° C. respectively, there were the tendencies shown in FIG. 4 were obtained. The curves *e* and *f* in the figure indicate Examples 23 and 44 respectively. When a determination was made of variations with temperature in the electromechanical coupling coefficient $K_{33}$ of said Examples 23 and 44, the curves of FIG. 5 were obtained, proving that the high Curie point of said examples allowed the electromechanical coupling coefficient $K_{33}$ to vary very little over a temperature range of −100 to 200° C., proving that a fully high electromechanical coupling coefficient could be used under stable conditions. The curves *g* and *h* of FIG. 5 represent Examples 23 and 44 respectively. The results of measurements when the generated voltage was varied for piezoelectric materials having the compositions of Examples 11, 24, 45 and 62 and constituting piezoelectric ignition units, are reported in Table II, which also presents for reference the results of testing piezoelectric ignition units composed of the conventional piezoelectric material: $Pb(Ti_{0.47}Zr_{0.53})O_3$+100 wt. percent $Nb_2O_5$ (Reference α).

TABLE II

| Sample | No. of impacts | | | | | Decrease in $K_{33}$ (percent) |
|---|---|---|---|---|---|---|
| | 1 | $10^3$ | $10^4$ | $10^5$ | $10^6$ | |
| Example: | | | | | | |
| 11 | 15.3 | 15.2 | 15.0 | 14.9 | 14.8 | 3.3 |
| 24 | 15.6 | 15.6 | 15.5 | 15.3 | 15.2 | 2.6 |
| 45 | 16.5 | 16.5 | 16.5 | 16.3 | 16.2 | 1.8 |
| 62 | 16.0 | 16.0 | 16.0 | 15.9 | 15.8 | 1.3 |
| Reference α | 15.5 | 15.0 | 14.3 | 13.7 | 13.0 | 15.6 |

Table II clearly shows that all the piezoelectric materials of the invention are excellent.

When pressure of 1 ton per $cm.^2$ was repeatedly applied to elements having compositions corresponding to those of Examples 5, 17, 55 and 83 to determine variations in $K_{33}$, there were obtained the results of FIG. 6. The piezoelectric materials of Examples 5, 17, 55 and 83 only presented a decline of less than 10% in $K_{33}$, while the conventional product having a composition of $Pb(TiO_{0.46}Zr_{0.54})O_3$+0.9 wt. percent $Nb_2O_5$ (Reference β) and $Pb(TiO_{0.47}Zr_{0.33})O_3$+0.7 wt. percent $La_2O_3$ (Reference α) indicated a decrease of scores of percent in $K_{33}$. The curves *i*, *j*, *k* and *l* represent Examples 5, 17, 55 and 83 respectively and the curves *m* and *n* References β and α respectively.

It is evident from the above examples that the piezoelectric materials of this invention exhibit little variation in piezoelectric properties as confirmed by the heating and breakdown tests, thus displaying excellent performances as transducer elements such as piezoelectric ignition elements, namely, affording many industrial advantages.

What we claim is:

1. A piezoelectric oxide material having a composition of 0.3 to 30 mol percent $(Me_{1/2}La_{1/2})(Na_{1/2}Te_{1/2})O_3$ where Me is at least one metal selected from the group consisting of Ba, Sr, Ca and Pb, 60.0 to 30.0 mol percent $PbTiO_3$ and 55.0 to 25.0 mol percent $PbZrO_3$, wherein the sum of $(Me_{1/2}La_{1/2})(Na_{1/2}Te_{1/2})O_3$, $PbTiO_3$ and $PbZrO_3$ equals 100 mol percent.

References Cited

UNITED STATES PATENTS 3,268,453 8/1966 Ouchi et al. ________ 252—62.9
3,309,168 3/1967 Bayer ___________ 252—62.9 X
3,309,169 3/1967 Bayer ___________ 252—62.9 X
3,463,732 8/1969 Banno et al. ________ 252—62.9
3,468,799 9/1969 Kurihara et al.

OTHER REFERENCES

Bayer: "Journal of the American Ceramic Society," vol. 46, No. 12, December 1963, pp. 604–5.

TOBIAS E. LEVOW, Primary Examiner

J. COOPER, Assistant Examiner

U.S. Cl. X.R.

106—39 R